United States Patent [19]

Kikinis et al.

[11] Patent Number: 5,412,538
[45] Date of Patent: May 2, 1995

[54] SPACE-SAVING MEMORY MODULE

[75] Inventors: Dan Kikinis, Saratoga; William J. Seller, Scotts Valley, both of Calif.

[73] Assignee: Cordata, Inc., Roadtown, Virgin Islands (Br.)

[21] Appl. No.: 93,774

[22] Filed: Jul. 19, 1993

[51] Int. Cl.6 ............................................. H05K 1/14
[52] U.S. Cl. ..................... 361/792; 361/750; 361/761; 361/790; 174/260; 174/262; 257/686
[58] Field of Search .................. 361/748, 749–751, 361/760, 761, 764, 767, 784–791, 792; 174/260, 262; 257/685, 686, 777; 29/832; 437/208, 915

[56] References Cited

U.S. PATENT DOCUMENTS 5,001,604  3/1991  Lusby ........................... 29/846

FOREIGN PATENT DOCUMENTS 1225827  10/1986  Japan ........................... 257/686
5037121   2/1993  Japan .

OTHER PUBLICATIONS

IBM, Technical Disclosure Bulletin, pp. 1433–1434, vol. 29, No. 3, Aug. 1986.

*Primary Examiner*—Bot Ledynh
*Attorney, Agent, or Firm*—Donald R. Boys

[57] ABSTRACT

A low-profile printed circuit board has discrete components mounted within openings provided in a rigid substrate forming art of the board. The components are mounted with leads soldered to mounting pads on the surface of the board, and arranged around the periphery of the openings. The stand-off design of discrete components for mounting to the surfaces of boards allows such components to be mounted within openings simply by reversing the orientation of the components relative to the board. In a preferred embodiment a DRAM card is a four-level board with circuitry on each side of a thin, flexible substrate and each side of a rigid substrate, the two substrates spaced apart by a thin, insulating layer. The rigid substrate has openings with DRAM modules mounted within the openings, and further modules are mounted on the opposite surface in the conventional manner.

8 Claims, 3 Drawing Sheets

SPACE-SAVING MEMORY MODULE

FIELD OF THE INVENTION

The present invention is in the area of hardware architecture for computers, and pertains more specifically to apparatus and methods for fabricating Dynamic Random Access Memory (DRAM) modules on printed circuit boards to save space.

BACKGROUND OF THE INVENTION

The general trend in the electronics packaging technology is toward miniaturization both of discrete components and integrated circuits (ICs). A good example is in the notebook and sub-notebook computer field. As more functions are integrated on an IC, more connections off the chip are required, and more circuit traces are needed to interconnect them.

With the advancement to very large scale integration (VLSI) in IC circuit design the requirement for dense circuitry has risen almost exponentially. Additionally, Surface Mount Technology (SMT) has provided even higher printed circuit board (PCB) densities by reducing the required sizes of components, input/output (I/O) connections, and the width of line traces. SMT allows the use of both sides of a PCB since the electrical components are soldered to the surface only. This has stimulated further developments in laminating successive layers of electrical circuit traces and layers of insulators.

As a result of these technological advancements in microelectronics a great deal of effort has been placed on increasing "connectivity," or the ability of a printed wiring process to provide electrical connection to all nodes in a circuit. The result is a concurrent reduction in conductor line (trace or line ratio) width, and an increase in the number of conductor layers. Therefore, a dramatic increase in capability for circuit density and complexity has resulted. The increase in conductive circuit layers has led to development of Multilayered Circuit Boards (MLBs). MLBs provide a reliable cost effective engineering solution for microcircuit packaging.

FIG. 2 is an illustration of a four-layered MLB. By definition, MLBs have three or more circuit layers. To make a board of this sort, networks of passive circuit elements are deposited in predetermined geometric patterns on surfaces of insulating substrates. The substrates are later joined to provide a single structure with multiple layers of circuitry.

A widely practiced method or making MLBs is by bonding, or laminating, the separate layers of patterned, pre etched, plated-through-hole, copper-clad laminates together. A plated through hole (PTH) 67 is the electrical pathway for interconnection of "buried" layered circuits in the MLB. A typical multilayer circuit board is made up of successive layers of conductive circuits such as layers 63A, 63B, 65A & 65B that have typically been phototactrally traced and chemically etched, epoxy-resin-glass dielectrics 61, and epoxy-glass that has been dried and partially cured. This partially cured epoxy-glass serves as the bonding material (glue or prepreg) to hold the board together.

The dual copper plate with an epoxy-glass, Invar layer 60 along with the dielectric 61 is railed the substrate. The copper layers 63A & 63B in this example provide power circuitry to the exposed trace circuits. PCB substrate material is an important part of overall structural integrity for any MLB and must closely match the conductive trace layer's thermal expansion rate. The dielectric constant of the substrate is one factor determining the board's required conductive trace width. The trace width is the physical dimension measured across one conductive circuit path in the plane of the printed circuit board. Each individual circuit trace is the electrical pathway to one of many circuits to one or more electrical components.

A commonly used industrial substrate is FB4 board. The stack of layers is typically heated under pressure until the glue or preppeg is cured. MLBs inner layers of circuits 63A and 63B in FIG. 2, formed by printing and etching, can also be interconnected by drilled and plated through holes, and become buried interconnections or buried vias.

The concept of "real estate" in designing a PCB is an important design parameter. The MLBs also provide the designer an opportunity to use both sides of the PCB to accommodate the increased number of components and provide required air flow fop cooling. Perpendicular plane mounting in relation to a mother board, a shown in FIG. 1A, is a common practice for uniform convection cooling and allows higher circuit densities than would otherwise be useful. These subassemblies represent one packaging hierarchy in general design criteria.

An integrated circuit such as a DRAM is typically packaged as a module 19, as shown in FIGS. 1A and 1B, and then assembled on a multilayer PCB with other modules and possibly with other components, such as resistors, capacitors, as shown in FIG. 1A. The PCB, also known as a "card", has a standardized I/O interface that fits into a plug receptacle 41 on the motherboard, as shown in FIG. 1B. This also provides for a larger "virtual" board that minimizes connectors and keeps the motherboard backplane smaller. The multilayer card is a second level in packaging hierarchy that allows for higher I/O connection count per board and shorter circuit paths between many components. Thus the system has higher speeds to accommodate high frequency CPUs. The overall system conserves power by reducing the number of active component in the system. Such a DRAM card is called a memory module in the art.

DRAM is high-speed memory that holds binary instructions and data which is transferred between hardware units by machine control routines. DRAM modules are present in most sophisticated computerized machinery. In particular, the computer field has been memory driven in system and software design. For example, today's portable computer technologies compete with the performance of desk-top microprocessor units.

To capture a market segment for portable computing, the industry must provide smaller, lighter-weight notebook and sub-notebook computers. These computers also need to incorporate high frequency CPUs used in powerful desk-top units and the memory to support state-of-the-art software applications. To provide the needed memory, DRAM occupies more and more valuable real estate in portable computers.

FIGS. 3A and 3B are sectional views of idealized four-layer memory module MLBs in current art. FIG. 3A is a one-sided memory module 40 comprising packaged DRAM ICs such as DRAM 42 soldered to surface mounting pads, and FIG. 3B shows a double-sided memory module 44. Two sided memory module 44 takes up about 50% more volume then single-sided module 40.

What is needed to provide a significantly higher circuit density to further miniaturize notebook and sub-notebook computers is a more space efficient PCB system for memory modules and discrete electronic components. The module miniaturization of DRAM could then be transferred to smaller motherboard designs and thus, faster circuitry. Such a system should address the density of all related electronic components and the heat dissipation required. In such a system, a space-saving module would preferably be amenable to existing manufacturing techniques and materials.

SUMMARY OF THE INVENTION

In a preferred embodiment of the present invention a printed circuit board comprises a substrate for supporting circuitry and discrete components for the printed circuit board, the substrate means having a thickness equal to or greater than the height of one of the discrete components to be mounted, and having an opening through the thickness, the opening having width and length in the plane of the substrate sufficient to surround one of said discrete components. There is first circuitry for providing electrical connections to leads of the discrete components, the first circuitry arrayed on a first side of the substrate and comprising mounting pads for connecting to leads of the discrete components. A portion of the mounting pads are positioned around the periphery of the opening in a manner that one of the discrete components may be mounted within the opening.

In another embodiment, printed circuitry is provided on both sides of a board, and discrete components are mounted on one side in the conventional manner and the other side within openings in the board. In yet another embodiment a four-level board is provided with printed circuitry on both sides of a flexible substrate and both sides of a thicker rigid substrate. The rigid substrate has openings for mounting discrete components, and the two substrates are joined with an insulating layer in between. A preferred application is a DRAM memory card, with memory modules mounted on both sides, on one side within openings in the board.

DESCRIPTION OF THE PREFERRED EMBODIMENTS

The development of microelectronics packaging parallels the advancements in circuit integration of ICs. In the computer field, smaller and more powerful units such as notebook and sub-notebook computers are in increasing demand.

The packaging hierarchy within a small computer has a powerful influence on the limits of its performance. One of the most important criteria of performance is having sufficient memory to run state-of-the-art multiple software applications.

In one embodiment, the present invention provides about a 50% increase in usable volumetric "real estate". The Space Saving Memory Module in this embodiment is a hybrid PCB using both rigid and flexible construction materials.

Figure 1C:
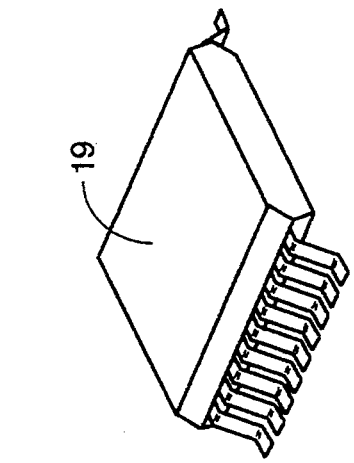
FIG. 1C is an illustration of a DRAM module as known in the art.
Figure 1B:
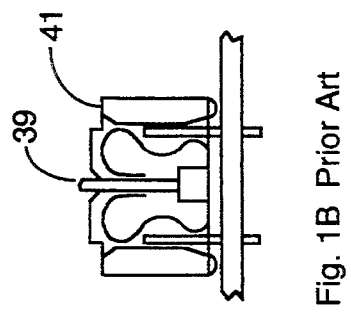
FIG. 1B shows a conventional connection technology.
Figure 1A:
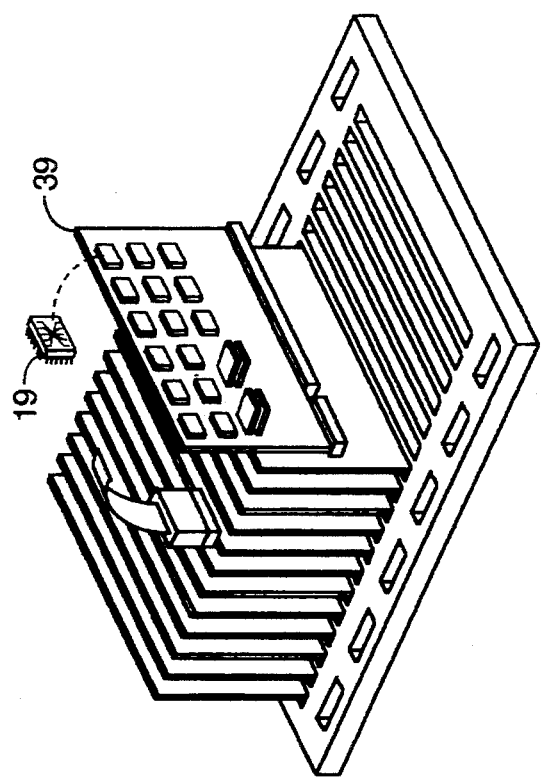
FIG. 1A shows a motherboard and PCB modules in a conventional configuration.

As previously described, FIG. 1A shows a conventional hardware layout in a microcomputer. Here, multiple PCB boards or cards 39 are positioned in rows of receptacles that closely stack the individual PCBs. The PCB card in this case is a second level module in packaging hierarchy. Surface mounting technology of DRAM modules and other discrete components is a third level.

FIG. 1C shows a typical manufactured DRAM packaged module, and is of a type known in the art as a Very Small Outline Package (VSOP). The leads are a gull-wing design (see also FIG. 1D) and meet critical design criteria in strength, thermal properties and electrical properties. The I/O connections of the packages is standardized and the structural mounting is partly dependant on the I/O placement.

Memory modules such as DRAMs are conventionally mounted in the manner shown in FIG. 1A–1D in a designated area on the back plane or motherboard, usually as close as possible to the CPU to keep transfer times to a minimum. The relative practical clearances between DRAM boards dictate the usable real estate on the motherboard. The perpendicular placement of DRAM module PCBs as in FIG. 1A is one example of mounting technology and many other packaging arrangements are possible.

Figure 2:
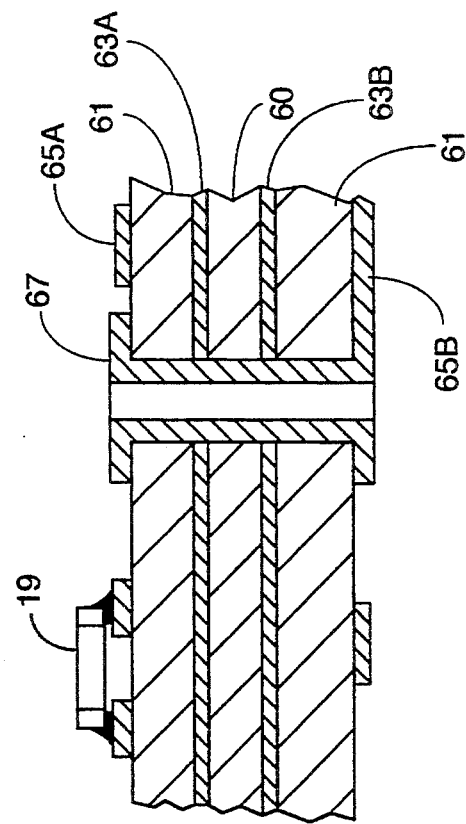
FIG. 2 is an idealized cross-sectional view of a conventional multilayer printed circuit board.

FIG. 2 is an idealized cross-sectional view of a conventional multilayer printed circuit board.

Figure 3A:
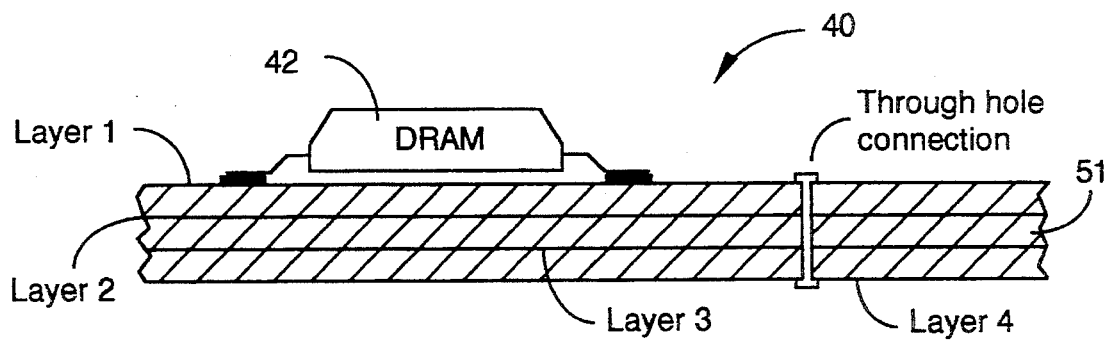
FIG. 3A is an idealized cross-sectional view of a conventional single-sided DRAM memory module.
Figure 3B:
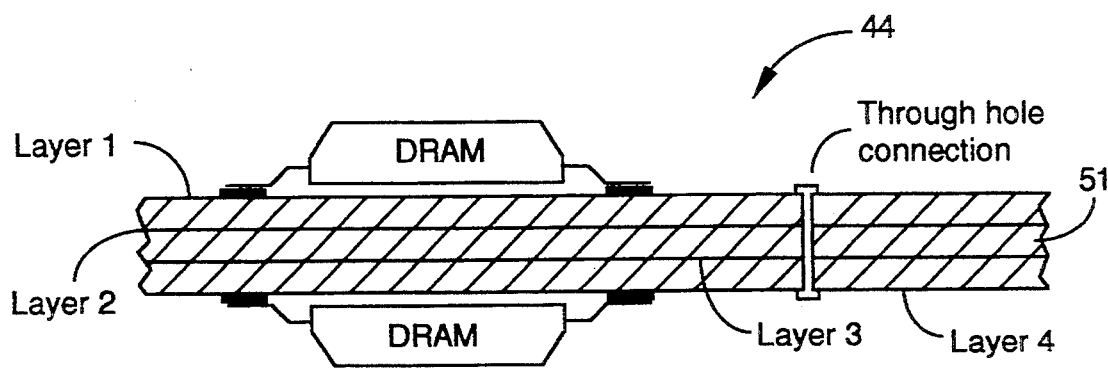
FIG. 3B is an idealized cross-sectional view of a conventional double-sided DRAM memory module.

FIG. 3A, as described also above, is a cross sectional view of a one-sided four layer module, and FIG. 3B is a cross sectional view of a double-sided memory module. Both of these memory modules use surface mounting technology on a four-layered MLB.

A commonly used, cost effective, and durable substrate used in MLBs is FR4. FR4 is an epoxy-resin-glass fiber material. Such laminates are economical and lend themselves rather easily to processing into multilayer boards by heat and pressure. In addition, they can be readily drilled without major problems associated with smearing interconnected circuit traces, and they hold up well to heat and solvents.

The thickness of a multi-level board is typically set by industry standard, and the materials and construction must also conform to established engineering requirements for such characteristics as thermal expansion, dielectric constant, and strength. These standards are known in the art.

Also as described previously, a double-sided memory module 44 (FIG. 3B) assumes about 50% more volume than a single-sided module 40 (FIG. 3A). This represents the current technology. In these single and double-sided boards Layers 1 and 4 are typically patterned for the circuit signals for the surface mounted DRAM ICs. Layers 2 and 3 are typically patterned for circuitry for the power and ground voltage levels connected by vias such as plated through holes to the active circuitry. An insulating substrate 51 separates power signals.

Figure 4:
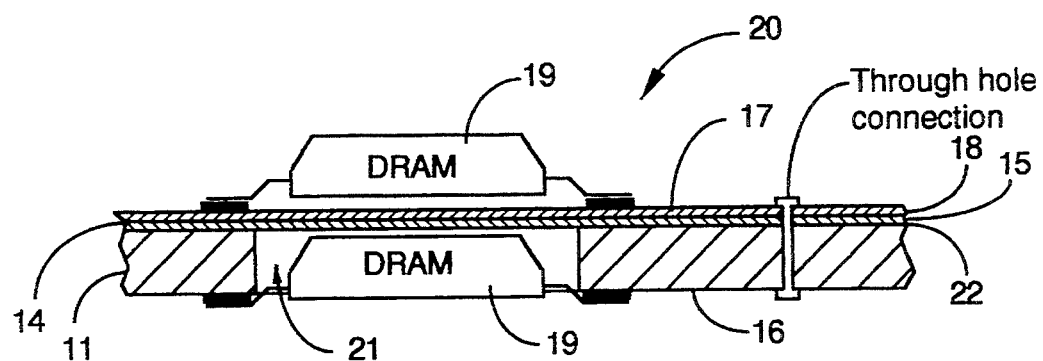
FIG. 4 is a cross-sectional illustration of a multi-layered PCB according to an embodiment of the present invention.

FIG. 4 is a cross sectional view of a PCB 20 that is an embodiment of the present invention. There are two DRAM modules 19 shown mounted on PCB assembly 20. DRAM modules 19 in this embodiment are surface mounted gull-winged-lead DRAMs. SMT circuitry 17 is patterned on a layer 18 of Kapton film. Film 18 is a flexible material, and Kapton film is a registered trademark of E.I.Dupont.

The thin-film technology deposits coats of conductors or insulators by methods of sputtering, CVD or evaporation at low enough temperatures to avoid flow of the base material. In the embodiment of FIG. 4 circuitry layer 17 is deposited and patterned, along with SMT pads, on one side of flexible layer 18, and circuity is also deposited and patterned on the side opposite circuitry layer 17. This opposite layer is layer 14 in FIG. 4. Circuitry layer 14 may be used for ground connections or for power connections, as before described for four-layer boards.

Two more layers of circuitry are provided by a rigid FR4-based PCB 11 with circuitry layers provided on both sides. Layer 16 has SMT pads in his embodiment, and layer 22 may be patterned for ground or power connections as previously described. FR4 is an inexpensive fire-resistant easily processible material, and is one example of several suitable materials. In other embodiments other rigid materials may be preferred.

In the embodiment of FIG. 4 DRAMs 19 are recessed into closely-fitted openings 21. The DRAM modules are placed to the SMT pads with what would be the "upper" side of the gull-wing leads in contact with the pads, and are soldered in this position with the bulk of each package thus recessed in the openings 21. The cross section of a gull-winged lead is symmetrical and structural integrity of reverse mounting and soldering of gull-winged lead DRAM packages and other ICs is essentially the same as for conventional mounting.

The rigid substrate 11 with circuitry on two sides and the flexible substrate 18 with circuitry on two sides, are adhesively joined to provide a single structure, and are separated in joining by a film of polyamide dielectric 15 with a thickness of about 15 micrometers. Layer 15 is an insulative layer to electrically separate the circuit layers 14 and 22. Polyamides are employed in many flexible circuits because of their film strength, ability to withstand 350 degrees Celsius for brief periods, high dielectric strength, and good resistance to a broad range of organic solvents. Other materials may be preferred in different embodiments of the invention.

The unique structure, with about one-half of the supported DRAM component packages recessed in one surface forming a Space Saving Memory Module provides memory capacity about equal to a standard rigid 4-layered, double-sided PCB (FIG. 3B) in about one half the width. This space savings can also be applied to discrete components such as resistors, capacitors, and inductors, each in pre-sized recesses in the double-layered or multilayered PCB in other embodiments of the invention.

Cooling can be improved for the unique board in the described embodiments by PTH connections in separation layer 15 and/or by air flow-through holes through layers 15 and 18 into the openings such as opening 21. In this embodiment, the air holes provide maximum convection air flow between both the top and bottom DRAM ICs 19.

Tilere is a thermal advantage in reverse mounting DRAM packages in the recess openings. The internal die, which is the center of concentrated heat generation, is facing outward toward air flow in this mounting, rather than down toward the PCB as in conventional mounting.

Figure 5A:
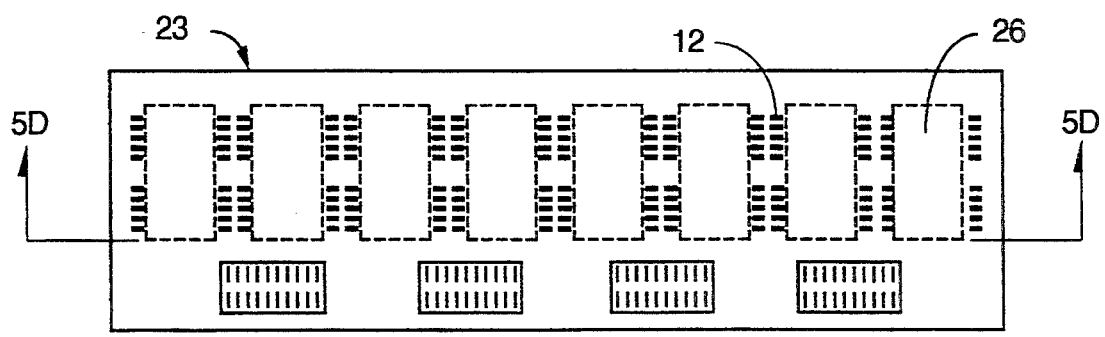
FIG. 5A is a plan view of one side of a memory module card 23 according to an embodiment of the present invention, before adding DRAM ICs.

FIG. 5A is a view of the top side of a memory module board 23 according to an embodiment of the invention before adding ICs. There are in this embodiment eight positions 26 for DRAM modules, each surrounded by DRAM IC solder pad locations 12 on a top layer of conductive Kapton circuitry. The traces of the conductive circuitry are not shown in FIG. 5A.

Figure 5C:
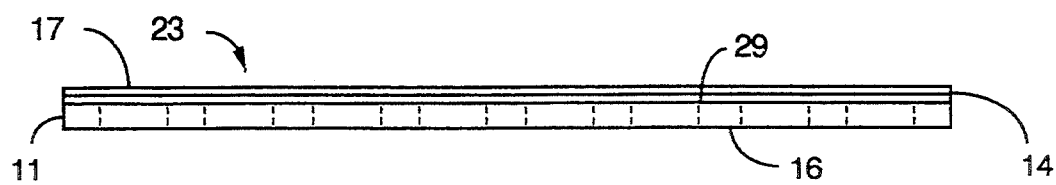
FIG. 5C is an elevation view of the memory module card of FIG. 5A.
Figure 5B:
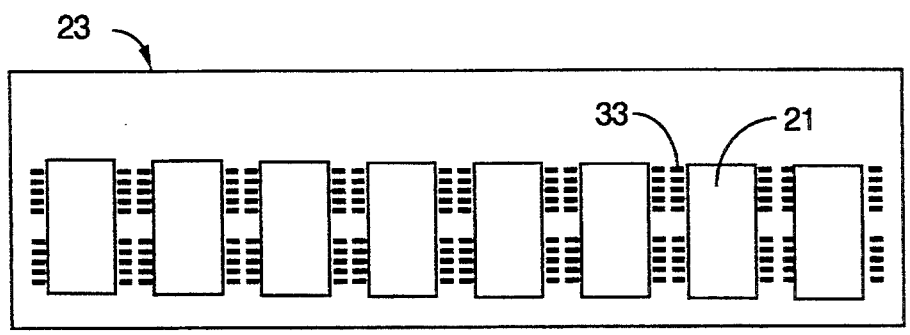
FIG. 5B is a plan view of the opposite side of memory module card 23 of FIG. 5A.

FIG. 5B is a view of the bottom of module board 23 before adding ICs. On this side there are eight DRAM IC recess openingis 21 with solder pads 33 surrounding each opening. In yet another embodiment of the invention these surface mounting pads are also recessed to vary the total width of the Space Saving Module. This feature also eases assembly of the ICs since the leads fall naturally into the right position. Another embodiment comprises a mounting agent with a good coefficient of heat conduction interposed between the top and/or sides of the ICs and adhering to either the rigid PCB board 11 or to the lamination separator 15.

FIG. 5C is a side view of the board of FIG. 5A showing two-layer flexible substrate 18, and rigid FR4 substrate 11. There are four conductive circuitry traces in the unique PCB assembly in this embodiment: Top layer 17 on the flexible substrate, ground layer 14 on the opposite side of the flexible substrate from layer 14, a power layer 22 on one surface of FR4 board 11, and a bottom layer 16 on the other side of the rigid substrate. Insulating separator 15 is bonded above to the Kapton flexible substrate and below to the FR4 rigid substrate.

In yet another embodiment of the invention there is more than one stepped level of recessed components in the rigid substrate to accommodate particular packaging and circuit design requirements with any number of layered, laminated PCBs, Another embodiment uses heat sinks either individually or in a combination over recessed ICs. Internal passages are constructed to contain and direct flow of liquid coolants in yet another embodiment of the invention.

Figure 5D:
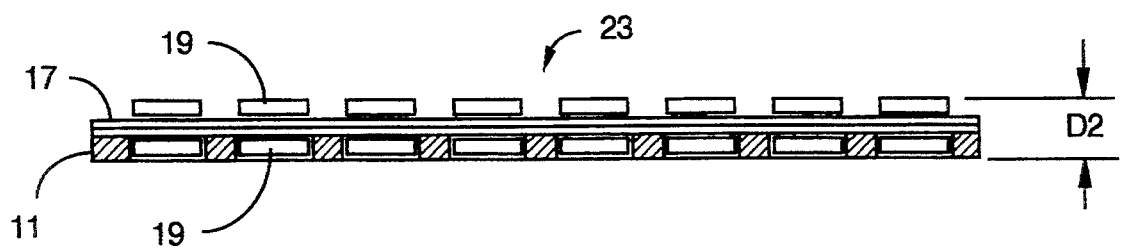
FIG. 5D is an elevation view of an assembled card with DRAMs according to the embodiment of the embodiment of FIGS. 5A, B, and C.

FIG. 5D is an elevation section view along line 5D—5D of FIG. 5A, showing the board of FIG. 5A with DRAMs 19 mounted to solder pads. The Space Saving Module in this embodiment comprises 16 DRAM IC packages.

One skilled in the art may adapt the Space Saving Module to larger memory configurations including any number of individual DRAMs ICs according to any required design application. Also, the recessed Space Saving Module can incorporate other surface mounting assemblies such as the Square Quad Flat Pac (SQFP), Rectangular Quad Flat Pac (RQFP), Plastic Leaded Chip Carrier (PLCC) and Leadless Ceramic Chip Carriers. Another embodiment might incorporate the use of J-leads and/or butt-leads.

Figure 1D:
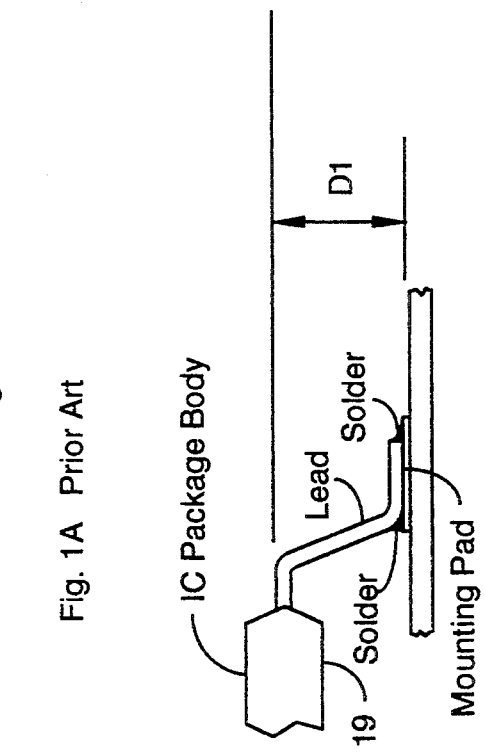
FIG. 1D is a partial sectional view of a typical IC soldered to a board, showing a lead configuration.

The overall thickness of the Space Saving Memory Module can vary according to different stand-off dimensions (FIG. 1D dimension D1). The choice of stand-off height among several available may be made according to heat transfer requirements and substrate thickness 11. Other factors that may influence overall board thickness in other embodiments are types and sizes of ICs and discrete components to be used, as well as design requirement of the MLBs.

The thickness D2 of the Space Saving Memory Module (FIG. 5B) is approximately the same as the thickness of a single-sided conventional board as seen in FIG. 3A, affording double the memory capacity in substantially the same volume. This is a very valuable feature, especially for compact computers, such as laptop, notebook, and palmtop models.

An additional advantage of the Space Saving Memory Module according to embodiments of the invention is in the simplicity of the board construction. The two-level board with film having traces on both sides forming the third and fourth layers is less costly to construct than a conventional four-layer PCB.

There are a number of ways components may be recessed below the surface of a multilayered PCB to accommodate engineering considerations such as thermal properties, protection from handling, ease of assembly, and general structural integration. For example, recessed components may be incorporated directly in the substrate as a coating or in the process of individual packaging.

It will be apparent to one with the skill in the art that there are many changes that might be made without departing from the spirit and scope of the invention. Some of these alternatives have already been described, such as various design applications involving the recessing of discrete electrical components into MLBs. Reasons for recessed components may include engineering priorities such as, but not limited to, thermal, structural, MLB lamination processing costs, individual packaging and packaging restraints.

The Space Saving Memory Module can be incorporated with injection molding technology in another embodiment of the invention. The recess openings for components in this case may be molded into the injection-molded board to accommodate any ICs or discrete components. Also, new lead designs may be developed in SMT specifically to take advantage of the Space Saving Module invention as disclosed in several embodiments herein, or other embodiments within the spirit and scope of the invention. Advancements in flexible thinfilm technologies may incorporate the Space Saving Module format by "wrapping" multilayer flex MLBs around alternately spaced recessed modules where the ICs are stress bonded to form the rigid plane or the board. Superconductor technology may incorporate recessed ICs as containers and/or structural elements. There are many other deviations that fall within the spirit and scope of the invention.

Further advancement in VLSI of ICs produces a greater number of I/O connections. Chip and the package technologies are interdependent. The nature of the Its that are actually used will depend on the package design's complexity and refinements. The invention introduces a level of packaging hierarchy that will keep pace with the rapid developments in microelectronics miniaturization.

What is claimed is:

1. A multi-layer primed circuit board comprising:
   a first flexible substrate formed of a polymer film and having first and second sides for supporting circuitry and discrete components, the discrete components each having a maximum overall height H;
   first and second connection circuitry for providing electrical connection to leads of the discrete components, the first and second connection circuitry arrayed on the first and second sides of the first substrate, the first connection circuitry comprising first mounting pads for connecting to electrical leads of the discrete components;
   a second substrate having third and fourth sides for supporting circuitry and the discrete components and thickness T equal to or greater than H, the second substrate having openings therethrough from the third side to the fourth side, providing spaces wherein the discrete components may be completely enclosed within the third and fourth sides;
   third and fourth connection circuitry for providing electrical connection to the discrete components, the third and fourth connection circuitry arrayed on the third and fourth sides of the second substrate and comprising second mounting pads arrayed around the openings for connecting to the electrical leads of the discrete components;
   an insulator layer fixedly mounted between the second and the third connection circuitry thereby spacing apart the first and the second substrates and forming a four layer printed circuit board; and
   through-hole connections for providing electrical communication between the first, second, third, and fourth connection circuitry.

2. A multi-level printed circuit board as in claim 1 comprising discrete components mounted on the first side with leads connected to the first mounting pads and discrete components mounted on the fourth side with leads connected to the second mounting pads, the discrete components mounted on the fourth side enclosed within the openings.

3. A multi-layer printed circuit board as in claim 2 further comprising first gull-wing design DRAM packaged integrated circuits mounted to the first mounting pads and second gull-wing design DRAM packaged integrated circuits mounted to the second mounting pads, the second DRAM packages enclosed within the openings.

4. A four-level DRAM memory card for providing memory to a host computer, comprising:
   a polymer-film flexible substrate having circuitry paths on first and second sides;
   first DRAM memory modules mounted on the first side with electrical leads connected to the printed circuitry.;
   a rigid substrate having circuitry paths on third and fourth sides and openings through the thickness of the rigid substrate;
   second DRAM memory modules mounted wholly within the openings with electrical leads connected to the circuitry paths on the fourth side;
   an insulator layer affixed to and spacing apart the second and third sides, spacing apart the flexible and rigid substrates;
   through-hole connections for providing electrical communication between the circuitry paths on the first, second, third, and fourth sides; and an edge connector for providing electrical connection from the circuitry paths to a host computer's parallel bus.

5. A method for making a four-level printed circuit board for mounting and interconnecting discrete components, comprising the steps of:
   (a) preparing a rigid substrate having a thickness greater than the maximum height of any of the discrete components to be mounted by forming openings therethrough of an extent to completely enclose the discrete components to be mounted;
   (b) forming connective circuitry on first and second sides of the rigid substrate, including mounting pads arranged around the openings on the second side for connecting to electrical leads of the discrete components;
   (c) preparing a substrate of polymer film by forming connective circuitry on third and fourth sides of the flexible substrate, including mounting pads for connecting to electrical leads of discrete components on the fourth side;
   (d) laminating the rigid substrate and the flexible substrate together with an insulator layer therebetween, forming thereby a four-level board with the second and forth sides exposed; and
   (e) fabricating through-hole connectors through the layers and substrates for connecting the four levels of connective circuitry.

6. The method of claim 5 further comprising steps:
   (f) mounting discrete components to the mounting pads on the fourth side; and.
   (g) mounting discrete components fully enclosed within the openings in the rigid substrate and connecting leads of the discrete components so mounted to the mounting pads around the openings on the second side.

7. The method of claim 6 wherein the discrete components mounted are memory modules, forming thereby a compact and low-profile memory card.

8. The method of claim 7 wherein the memory modules are DRAM modules.

* * * * *